(12) United States Patent
Liao et al.

(10) Patent No.: US 12,232,291 B2
(45) Date of Patent: Feb. 18, 2025

(54) ADJUSTABLE LENGTH CHASSIS

(71) Applicant: Quanta Computer Inc., Taoyuan (TW)

(72) Inventors: Ren-Cheng Liao, Taoyuan (TW); Ting-Kuang Pao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/211,200

(22) Filed: Jun. 16, 2023

(65) Prior Publication Data

US 2023/0337388 A1    Oct. 19, 2023

Related U.S. Application Data

(63) Continuation of application No. 17/449,853, filed on Oct. 4, 2021, now Pat. No. 11,729,936.

(51) Int. Cl.
*H05K 7/14* (2006.01)
*H02G 5/04* (2006.01)

(52) U.S. Cl.
CPC ............ *H05K 7/1492* (2013.01); *H02G 5/04* (2013.01); *H05K 7/1491* (2013.01)

(58) Field of Classification Search
CPC ....... H05K 7/1492; H05K 7/1491; H02G 5/04
See application file for complete search history.

(56) References Cited

U.S. PATENT DOCUMENTS 9,025,326 B1    5/2015   Xu
2013/0050963 A1  2/2013   Zhou et al.

FOREIGN PATENT DOCUMENTS

TW    201310831 A    3/2013

OTHER PUBLICATIONS

TW Office Action for Application No. 111105709, mailed Sep. 21, 2022, w/ First Office Action Summary.
TW Search Report for Application No. 111105709, mailed Sep. 21, 2022, w/ First Office Action.

*Primary Examiner* — Anthony M Haughton
*Assistant Examiner* — Hung Q Dang
(74) *Attorney, Agent, or Firm* — NIXON PEABODY LLP

(57) ABSTRACT

A server chassis includes a baseboard, a power distribution board, and a busbar module. The baseboard includes a front end and a rear end. The front end and the rear end define a chassis depth. The power distribution board is positioned on the baseboard. The busbar module includes a chassis-side busbar connector. The chassis-side busbar connector is configured to mate with a rack-side busbar connector. The rack-side busbar connector is positioned on a rack having a rack depth. The busbar module is adjustable, such that the chassis-side busbar connector mates with the rack-side busbar connector in a first configuration and a second configuration. In the first configuration, the rack depth is approximately equal to the chassis depth. In the second configuration, the rack depth is greater than the chassis depth.

13 Claims, 8 Drawing Sheets

ADJUSTABLE LENGTH CHASSIS

CROSS-REFERENCE TO RELATED APPLICATIONS

This application is a continuation of U.S. patent application Ser. No. 17/449,853, filed Oct. 4, 2021, now allowed, which is incorporated herein by reference in its entirety.

FIELD OF THE INVENTION

The present invention relates generally to computer chasses, and more specifically, to adjustable length computer chasses.

BACKGROUND OF THE INVENTION

For server racks supporting multiple computing units (e.g., servers), busbars are often used. The busbars can provide a convenient ground path between each computing unit mounted in a rack and the telecommunications bonding backbone.

For example, when a server rack is powered by one or more busbars, the location of a busbar connector is usually fixed and cannot be changed. As shown in FIG. 1, a prior art server rack system 100 includes a rack-side busbar connector 140 positioned on a vertical rail of a rack 120. The server rack system 100 also includes a chassis-side busbar connector 130 positioned at the rear end 114 of the server chassis 110. The chassis depth D1 of the server chassis 110 must match the rack depth D1 to ensure proper busbar connection between the chassis-side busbar connector 130 and the rack-side busbar connector 140.

As the market demands higher computing power and larger memory storage, the server racks become larger as well. Using the server rack system 100 shown in FIG. 1 as an example, for a server-rack system having a rack depth of 960 mm, the server-rack system can only accommodate a server chassis that also has a chassis depth of 960 mm. In other words, that server rack system cannot accommodate a smaller server chassis having a shorter chassis depth (e.g., 660 mm) because the chassis-side busbar connector of the smaller server chassis would stop short from mating with the rack-side busbar connector.

Thus, a need exists for an adjustable length chassis that can expand to connect with busbar-powered racks of various depths. The present disclosure is directed to such an adjustable length chassis that provides a cost-effective solution.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a server chassis includes a baseboard, a power distribution board, and a busbar module. The baseboard includes a front end and a rear end. The front end and the rear end define a chassis depth. The power distribution board is positioned on the baseboard. The busbar module includes a chassis-side busbar connector. The chassis-side busbar connector is configured to mate with a rack-side busbar connector. The rack-side busbar connector is positioned on a rack having a rack depth. The busbar module is adjustable, such that the chassis-side busbar connector mates with the rack-side busbar connector in a first configuration and a second configuration. In the first configuration, the rack depth is approximately equal to the chassis depth. In the second configuration, the rack depth is greater than the chassis depth.

In some examples, the busbar module further includes a cable management housing having a proximal portion and a distal portion. The busbar module is configured to alternate between the first configuration and the second configuration, while hinged to the baseboard at the distal portion of the cable management housing. In some examples, the chassis-side busbar connector is coupled to the proximal portion of the cable management housing. In some examples, the busbar module further includes a cable positioned within the cable management housing. The cable extends from the chassis-side busbar connector to the power distribution board, thereby communicatively coupling the chassis-side busbar connector to the power distribution board.

In some examples, in the first configuration, the busbar module is substantially stored within the chassis depth. In the second configuration, the busbar module is extended outward from the rear end of the baseboard. In some examples, the busbar module is configured to swing between the first configuration and the second configuration. In some examples, the busbar module is configured to retract and expand, thereby alternating between the first configuration and the second configuration. In some such examples, a retracted length of the busbar module is between 35% to 65% of an expanded length of the busbar module.

In some examples, the busbar module further includes a cable management housing. The busbar module is foldable, approximately at a midpoint of the cable management housing. In some examples, the server chassis further includes a rear wall positioned along the rear end of the baseboard. The busbar module is stored within a gap of the rear wall in the first configuration.

In some examples, the rack depth is at least 10%, 15%, 20%, 25%, 30%, 35%, 40%, 45%, or 50% greater than the chassis depth. In some examples, the busbar module further includes a cable management housing. The cable management housing includes a length defined between a proximal portion and a distal portion. The length of the cable management housing is less than the chassis depth in the first configuration. In some such examples, in the second configuration, the length of the cable management housing is at least 10%, 15%, 20%, 25%, 30%, 35%, 40%, 45%, or 50% of the chassis depth. In some examples, in the second configuration, a combination of the chassis depth and the length of the cable management housing is about the same as the rack depth.

According to certain aspects of the present disclosure, a busbar module includes a cable management housing, a chassis-side busbar connector, and a cable. The cable management housing includes a proximal portion and a distal portion. The busbar module is configured to couple to a baseboard of an adjustable length chassis, at the distal portion of the cable management housing. The baseboard includes a front end and a rear end. The front end and the rear end of the baseboard define a chassis depth. The cable management housing has a length less than the chassis depth. The chassis-side busbar connector is coupled to the proximal portion of the cable management housing. The chassis-side busbar connector is configured to mate with a rack-side busbar connector positioned on a rack. The rack has a rack depth greater than the chassis depth. The cable is positioned within the cable management housing. The cable is configured to extend from the chassis-side busbar connector to a power distribution board positioned on the baseboard of the adjustable length chassis, thereby communicatively coupling the chassis-side busbar connector to the power distribution board.

In some examples, the busbar module is configured to alternate between a first configuration and a second configuration, while hinged to the baseboard of the adjustable length chassis at the distal portion of the cable management housing. In some examples, in the first configuration, the busbar module is substantially stored within the chassis depth of the adjustable length chassis. In the second configuration, the busbar module is extended outward from the rear end of the baseboard. In some examples, the busbar module is configured to swing between the first configuration and the second configuration. In some examples, the busbar module is configured to retract and expand, thereby alternating between the first configuration and the second configuration. In some examples, the busbar module is removably coupled to the baseboard of the adjustable length chassis.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1:
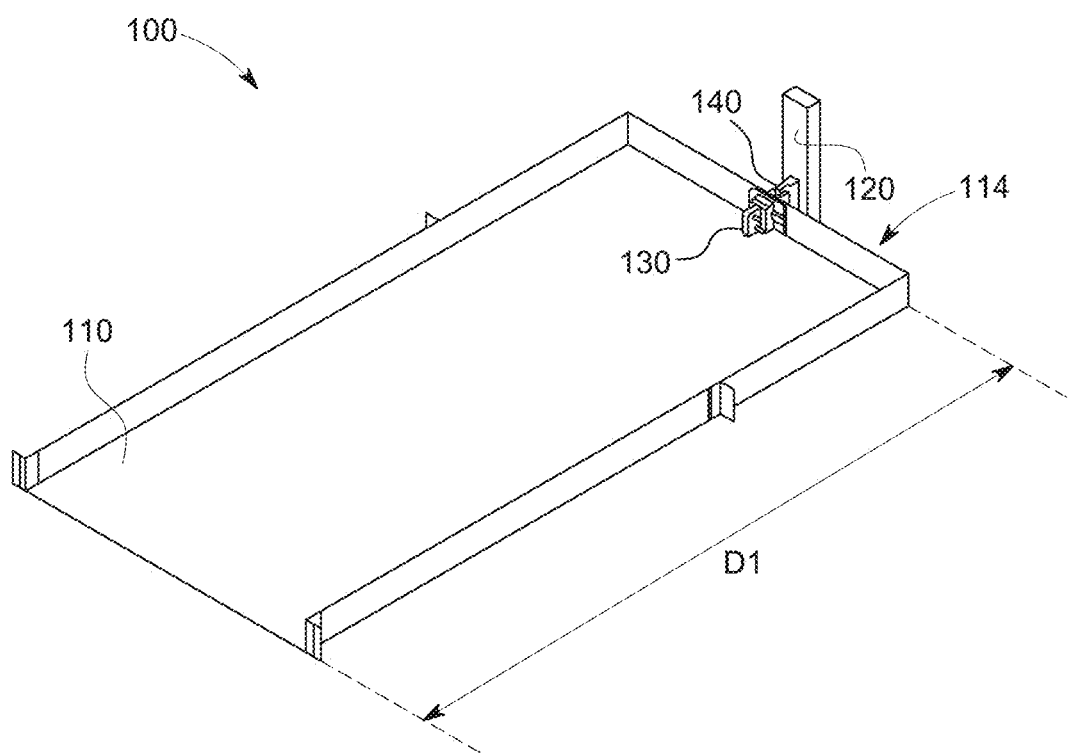
FIG. 1 is a perspective view of a prior art server chassis.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal configuration, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure is directed to an adjustable length chassis having a chassis depth. The adjustable length chassis includes busbar module that can alternate and/or switch between a first configuration and a second configuration. The busbar module provides a connection between a power distribution board of the adjustable length chassis and a busbar-powered rack. In the first configuration, the busbar module is housed within or removed from the adjustable length chassis, thus the adjustable length chassis can connect to a busbar-powered rack having a rack depth about the same as the chassis depth. In the second configuration, the busbar module extends along the chassis depth, thus the adjustable length chassis can connect to a busbar-powered rack having a rack depth that is greater than the chassis depth. For example, the adjustable length chassis may be a server chassis; and the busbar-powered rack may be a server rack. The adjustable length chassis may further include components such as a power supply unit, a hard disk drive module, a server node, a fan module, a PCIe card modules, etc.

Figure 2A:
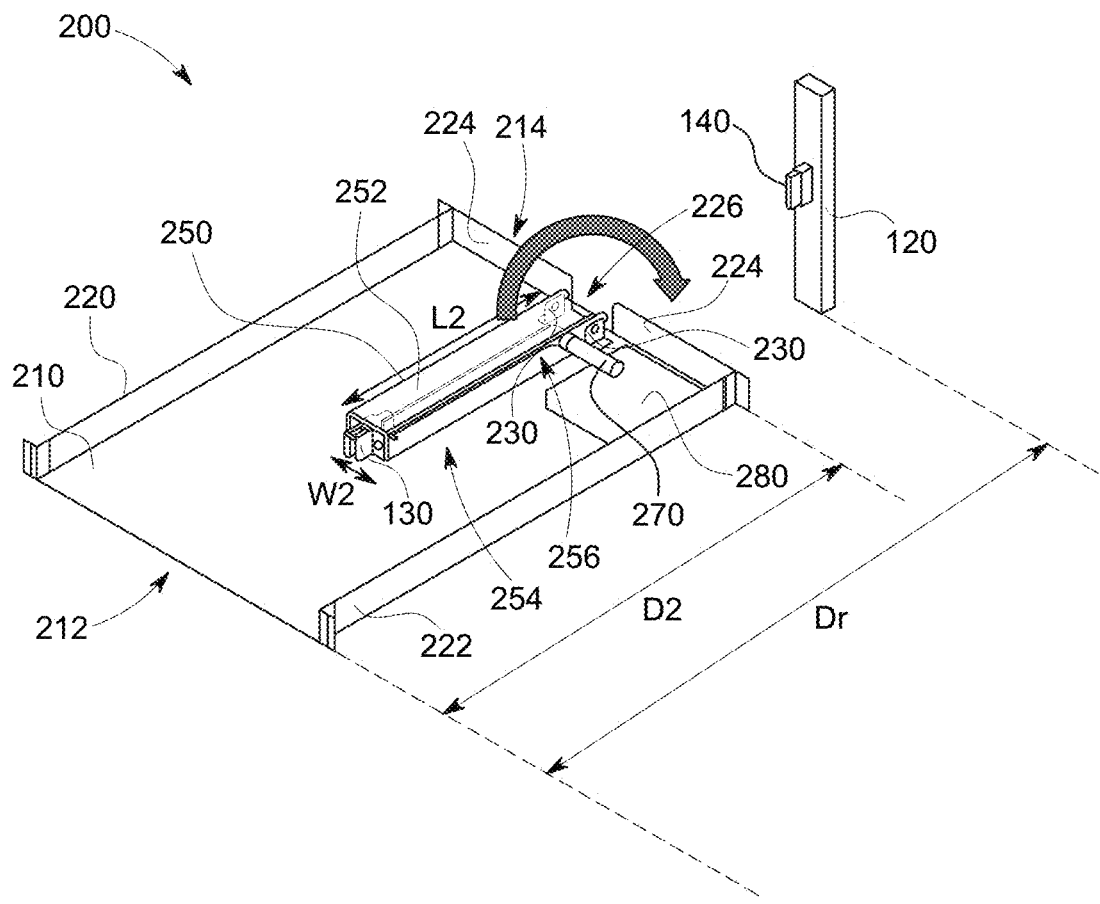
FIG. 2A is a perspective view of an adjustable length chassis in a first configuration, according to certain aspects of the present disclosure.

Referring to FIG. 2A, a perspective view of an adjustable length chassis 200 is shown in a first configuration, according to certain aspects of the present disclosure. The adjustable length chassis 200 includes a baseboard 210, a first side wall 220, a second side wall 222, a rear wall 224, a power distribution board 280, and a busbar module 250.

The baseboard 210 includes a front end 212 and a rear end 214. The first side wall 220 and the second side wall 222 extend (i) along two opposite sides of the baseboard 210 and (ii) from the front end 212 to the rear end 214. The rear wall 224 extends (i) along the rear end 214 and (ii) from the first side wall 220 to the second side wall 222. The front end 212 and the rear end 214 define a chassis depth D2.

The power distribution board 280 is positioned on the baseboard 210. While it is shown in FIG. 2A that the power distribution board 280 is positioned in proximity to the rear end 214 of the baseboard 210, the power distribution board 280 may be positioned anywhere on the baseboard 210 depending on the system design.

The busbar module 250 includes a cable management housing 252, a chassis-side busbar connector 130, and a cable 270 (e.g., a power cord). The cable management housing 252 includes a proximal portion 254 and a distal portion 256. The chassis-side busbar connector 130 is coupled to the proximal portion 254 of the cable management housing 252. The chassis-side busbar connector 130 is configured to mate with a rack-side busbar connector 140 positioned on a rear vertical rail of a rack 120 having a rack depth Dr.

The cable 270 is positioned within the cable management housing 252. The cable 270 extends from the chassis-side busbar connector 130 to the power distribution board 280. As such, the cable 270 communicatively couples the chassis-side busbar connector 130 to the power distribution board 280.

Figure 2B:
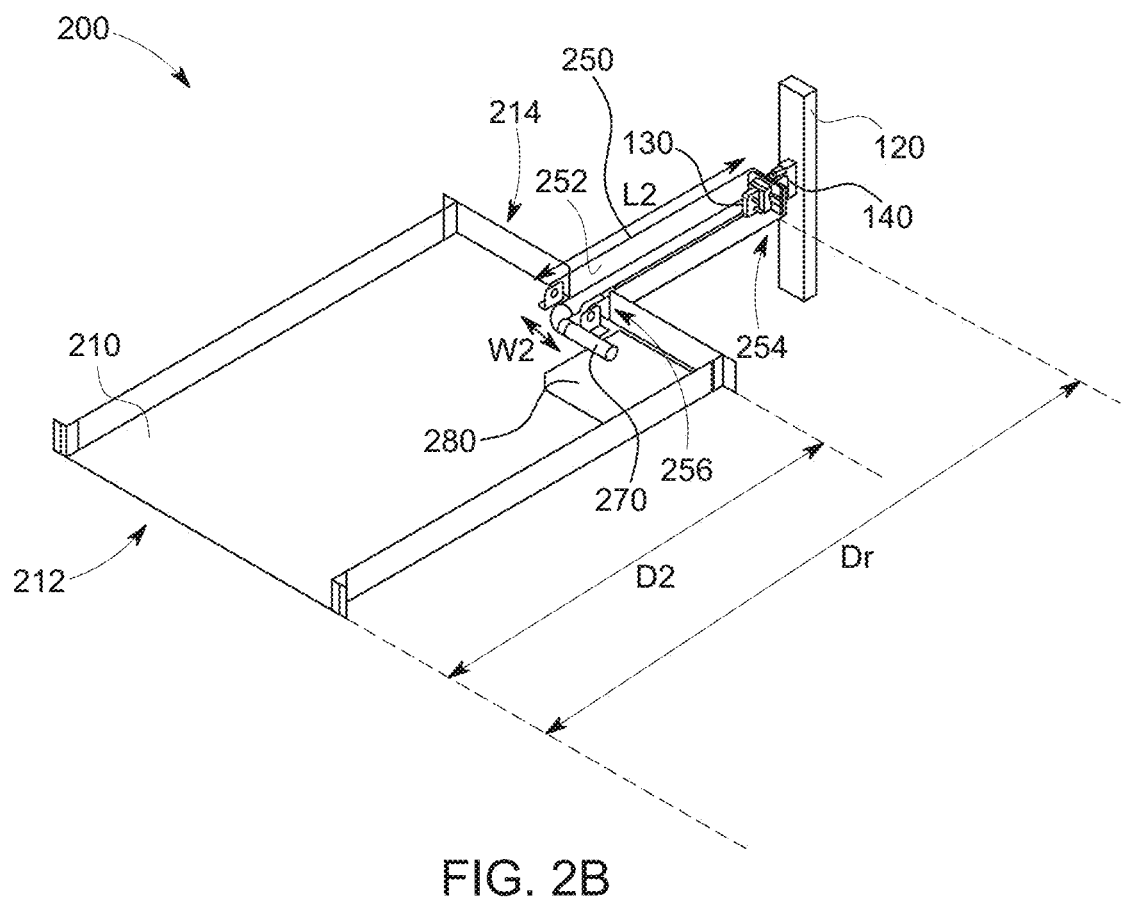
FIG. 2B is a perspective view of the adjustable length chassis of FIG. 2A in a second configuration, according to certain aspects of the present disclosure.

The busbar module 250 is configured to alternate between a first configuration (FIG. 2A) and a second configuration (FIG. 2B), while hinged (via a pair of anchors 230) to the baseboard 210 at the distal portion 256 of the cable management housing 252. In this example, the busbar module 250 is configured to swing 180 degrees between the first configuration and the second configuration. A gap 226 (FIG. 2A) on the rear wall 224 allows unobstructed movement of the busbar module 250 between the first configuration (FIG. 2A) and the second configuration (FIG. 2B). The gap 226 may have a width that is the same as, or greater than, the width W2 of the busbar module 250.

As shown in FIG. 2A, in the first configuration, the busbar module 250 is substantially stored within the chassis depth D2 of the adjustable length chassis 200. Thus, in this example, the busbar module 250 has a length L2 less than the chassis depth D2. The length L2 of the busbar module 250 may also be at least 10%, 15%, 20%, 25%, 30%, 35%, 40%, 45%, or 50% of the chassis depth, depending on the difference between the chassis depth D2 and the rack depth Dr.

Referring to FIG. 2B, a perspective view of the adjustable length chassis 200 is shown in a second configuration, according to certain aspects of the present disclosure. The adjustable length chassis 200 shown in FIG. 2B is the same as, or similar to, the adjustable length chassis 200 shown in FIG. 2A, where same reference numerals refer to same elements.

As shown in FIG. 2B, in the second configuration, the busbar module 250 is extended outward from the rear end 214 of the baseboard 210. The busbar module 250 is configured to aid in elongating the adjustable length chassis 200, which in turn allows the front end 212 of the baseboard 210 to be flush among other components in the rack (not shown). In this example, the chassis depth D2 of the adjustable length chassis 200 is 660 mm, and the rack depth Dr is 960 mm. Thus, the length L2 of the busbar module 250 is about 300 mm, which is the difference between the chassis depth D2 and the rack depth Dr. In other words, a combination of the chassis depth D2 and the length L2 of the busbar module 250 is about the rack depth Dr.

While it is shown in FIGS. 2A-4B that the chassis depth D2 is 660 mm, an adjustable length chassis of the present disclosure can have any suitable chassis depth. For example, a first alternative adjustable length chassis may have a chassis depth between 400 mm to 1200 mm; a second alternative adjustable length chassis may have a chassis depth of 500 mm; and a third alternative adjustable length chassis may have a chassis depth of 960 mm.

Figure 3A:
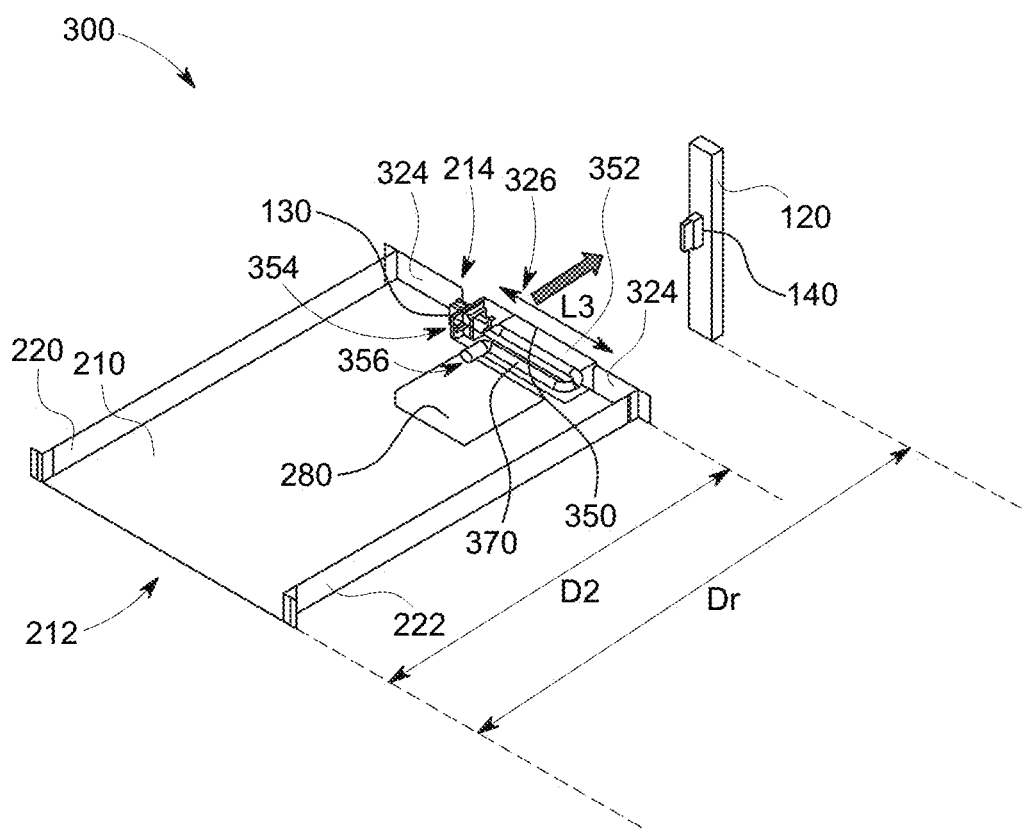
FIG. 3A is a perspective view of an adjustable length chassis in a first configuration, according to certain aspects of the present disclosure.
Figure 3B:
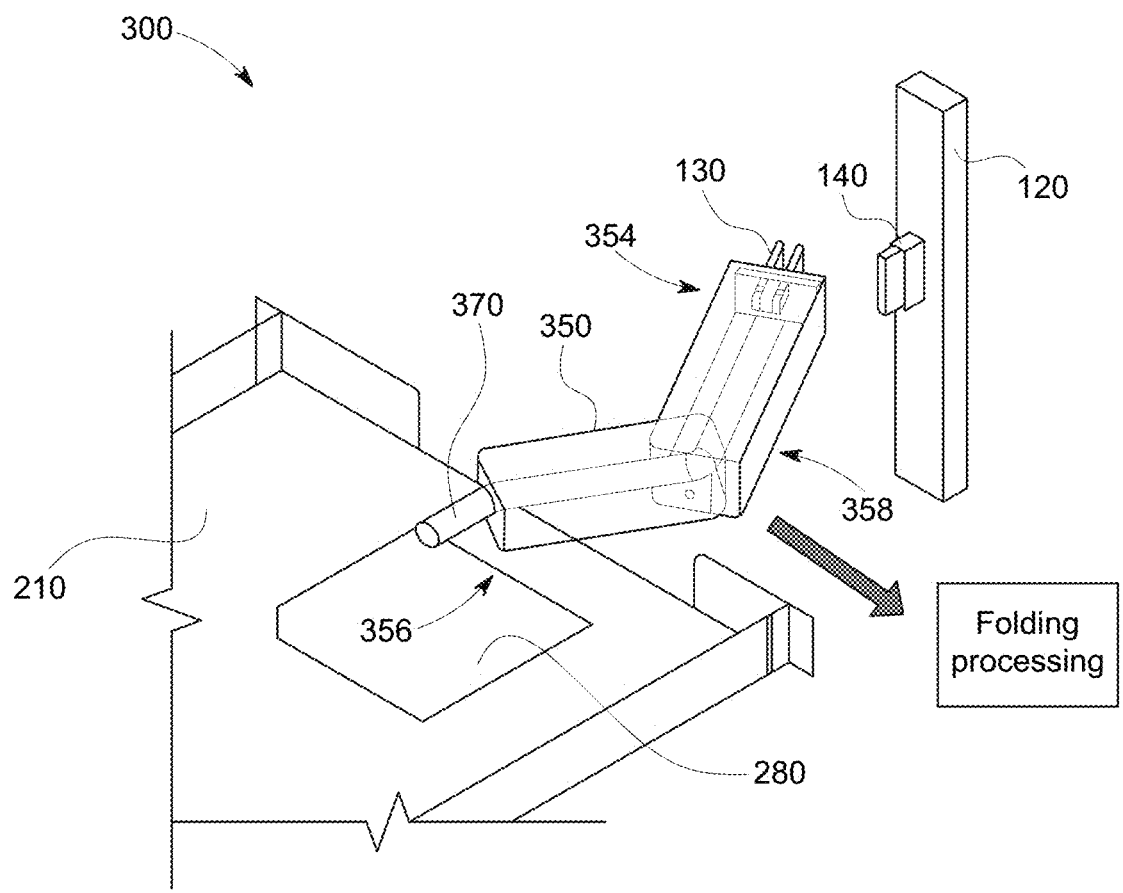
FIG. 3B is a perspective view of the adjustable length chassis of FIG. 3A expanding from the first configuration to a second configuration, according to certain aspects of the present disclosure.
Figure 3C:
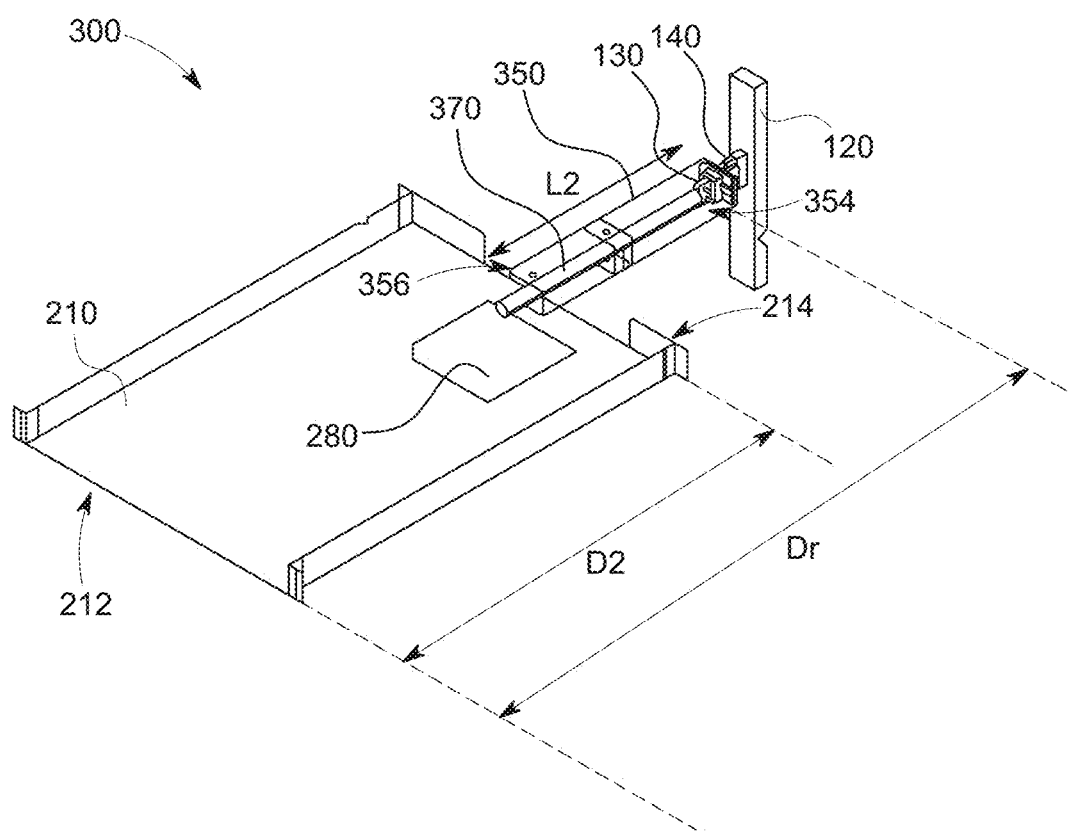
FIG. 3C is a perspective view of the adjustable length chassis of FIG. 3A in the second configuration, according to certain aspects of the present disclosure.
Figure 4A:
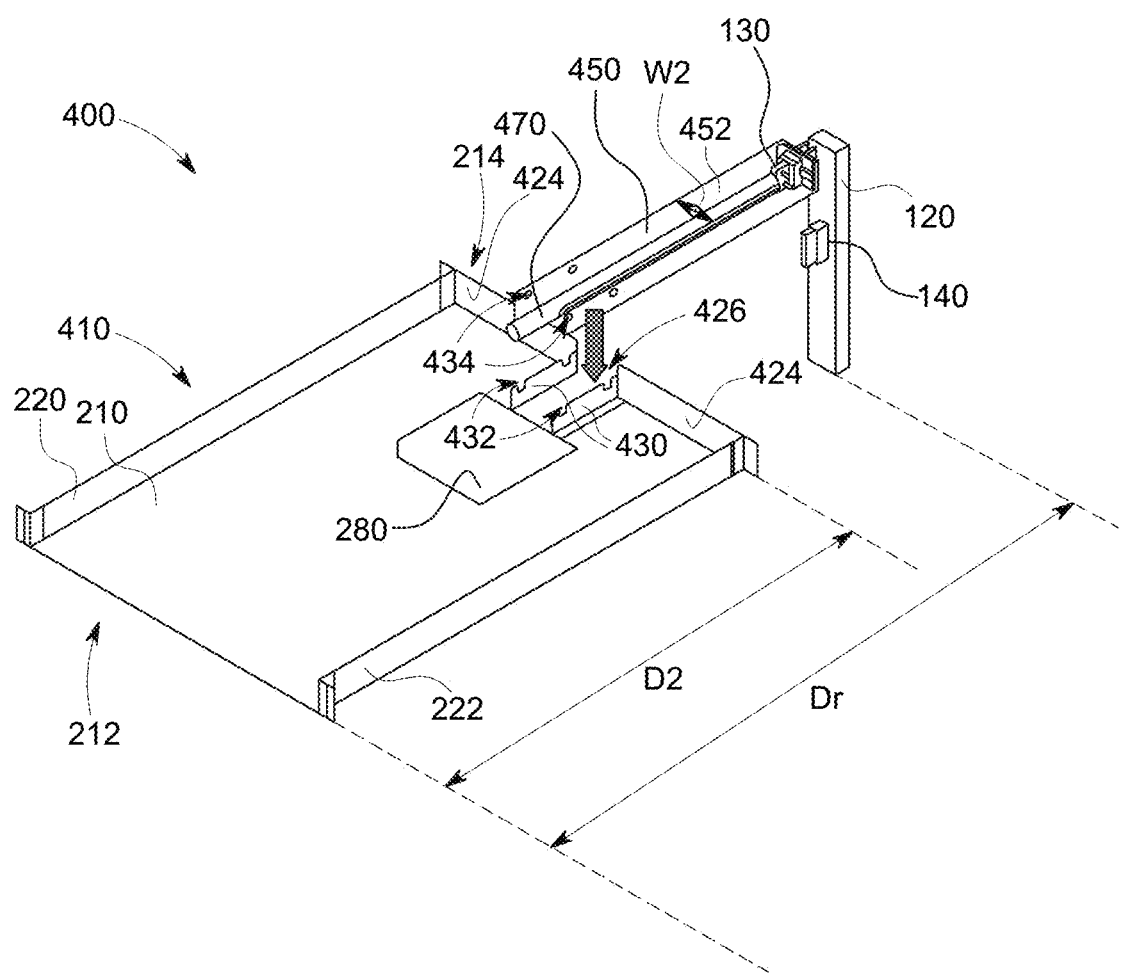
FIG. 4A is a perspective view of a busbar module prior to attachment to a chassis, according to certain aspects of the present disclosure.
Figure 4B:
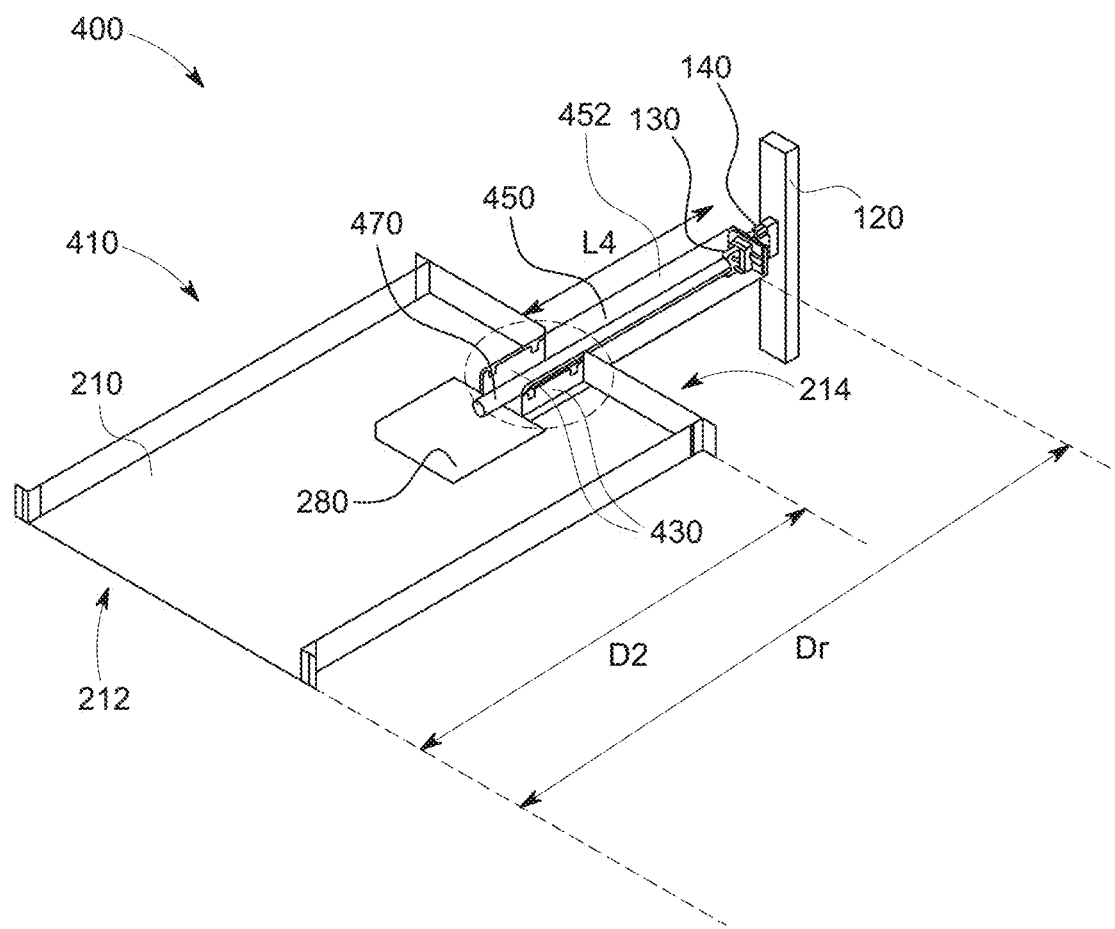
FIG. 4B is a perspective view of the busbar module of FIG. 4A attached to the chassis, according to certain aspects of the present disclosure.

While it is shown in FIGS. 2B, 3C, and 4B that the rack depth Dr is 960 mm, an adjustable length chassis of the present disclosure can connect to a busbar-powered rack of any suitable rack depth, so long as the rack depth is the same as, or greater than, the chassis depth of the adjustable length chassis. As an example, for an adjustable length chassis having a chassis depth of 660 mm, the busbar-powered rack may have a rack depth between 660 mm to 1,000 mm, such as between 800 mm to 900 mm. As another example, the rack depth is at least 10%, 15%, 20%, 25%, 30%, 35%, 40%, 45%, or 50% greater than the chassis depth.

Referring to FIG. 3A, a perspective view of an adjustable length chassis 300 is shown in a first configuration, according to certain aspects of the present disclosure. The adjustable length chassis 300 shown in FIG. 3A is similar to the adjustable length chassis 200 shown in FIGS. 2A-2B, where same or similar reference numerals refer to same or similar elements.

The adjustable length chassis 300 includes a baseboard 210, a first side wall 220, a second side wall 222, a rear wall 324, a power distribution board 280, and a busbar module 350. The baseboard 210 includes a front end 212 and a rear end 214. The first side wall 220 and the second side wall 222 extend (i) along two opposite sides of the baseboard 210 and (ii) from the front end 212 to the rear end 214. The rear wall 324 extends (i) along the rear end 214 and (ii) from the first side wall 220 to the second side wall 222. The front end 212 and the rear end 214 define a chassis depth D2. The power distribution board 280 is positioned on the baseboard 210.

The busbar module 350 includes a cable management housing 352, a chassis-side busbar connector 130, and a cable 370 (e.g., a power cord). The cable management housing 352 includes a proximal portion 354 and a distal portion 356. The chassis-side busbar connector 130 is coupled to the proximal portion 354 of the cable management housing 352. The chassis-side busbar connector 130 is configured to mate with a rack-side busbar connector 140 positioned on a rear vertical rail of a rack 120 having a rack depth Dr. The cable 370 is positioned within the cable management housing 352. The cable 370 extends from the chassis-side busbar connector 130 to the power distribution board 280. As such, the cable 370 communicatively couples the chassis-side busbar connector 130 to the power distribution board 280.

The busbar module 350 is configured to alternate between a first configuration (FIG. 3A) and a second configuration (FIG. 3C), while hinged to the baseboard 210 at the distal portion 356 of the cable management housing 352. In this example, the busbar module 350 is configured to retract and expand, thereby alternating between the first configuration (FIG. 3A) and the second configuration (FIG. 3C). Still referring to FIG. 3A, a gap 326 on the rear wall 324 allows the busbar module 350 to be stored therewithin. The gap 326 may have a width that is the same as, or greater than, a folded length L3 of the busbar module 350.

Referring briefly to FIG. 3B, a perspective view of the adjustable length chassis 300 is shown as halfway expanding from the first configuration (FIG. 3A) to the second configuration (FIG. 3C), according to certain aspects of the present disclosure. The adjustable length chassis 300 shown in FIG. 3B is the same as, or similar to, the adjustable length chassis 300 shown in FIG. 3A, where same reference numerals refer to same elements. As shown in FIG. 3B, the busbar module 350 is foldable at approximately midpoint 358 of the cable management housing 352 (in FIG. 3A).

Referring to FIG. 3C, a perspective view of the adjustable length chassis 300 is shown in the second configuration, according to certain aspects of the present disclosure. The adjustable length chassis 300 shown in FIG. 3C is the same as, or similar to, the adjustable length chassis 300 shown in FIG. 3A, where same reference numerals refer to same elements. As shown in FIG. 3C, in the second configuration, the busbar module 350 is expanded fully, and extended from the rear end 214 of the baseboard 210. The busbar module 350 is configured to aid in elongating the adjustable length chassis 200, which in turn allows the front end 212 of the baseboard 210 to be flush among other components in the rack (not shown).

In this example, the chassis depth D2 of the adjustable length chassis 300 is 660 mm, and the rack depth Dr is 960 mm. Thus, the expanded length L2 of the busbar module 350 is about 300 mm, which is the difference between the chassis depth D2 and the rack depth Dr. In other words, a combination of the chassis depth D2 and the expanded length L2 of the busbar module 350 is about the rack depth Dr. In another example, if the chassis depth D2 of the adjustable length chassis 300 is 500 mm, then the busbar module 350 may have an expanded length L2 of 460 mm to connect to a busbar-powered rack having the rack depth of 960 mm.

Comparing FIG. 3C to FIG. 3A, the retracted length L3 (FIG. 3A) of the busbar module 350 is less than the expanded length L2 (FIG. 3C) of the busbar module 350. For example, in some implementations, the retracted length L3 is between 35% to 65% of the expanded length L2 of the busbar module 350. In other words, if the expanded length L2 of the busbar module 350 is about 300 mm, then the retracted length L3 of the busbar module 350 may be between 105 mm to 195 mm, such as about 150 mm.

Referring to FIG. 4A, a perspective view of an adjustable length chassis system 400 is shown prior to attaching a busbar module 450 to a chassis 410, according to certain aspects of the present disclosure. The adjustable length chassis system 400 includes similar components to those of the adjustable length chassis 200 shown in FIGS. 2A-2B, where same or similar reference numerals refer to same or similar elements.

The chassis 410 of the adjustable length chassis system 400 includes a baseboard 210, a first side wall 220, a second side wall 222, a rear wall 424, and a power distribution board 280. The baseboard 210 includes a front end 212 and a rear end 214. The first side wall 220 and the second side wall 222 extend (i) along two opposite sides of the baseboard 210 and (ii) from the front end 212 to the rear end 214. The rear wall 424 extends (i) along the rear end 214 and (ii) from the first side wall 220 to the second side wall 222. The front end 212 and the rear end 214 define a chassis depth D2. The power distribution board 280 is positioned on the baseboard 210.

The busbar module 450 shown in FIG. 4A is similar to the busbar module 250 shown in FIGS. 2A-2B, except that the busbar module 450 can be removably attached to the baseboard 210 of the chassis 410 via a pair of anchors 430. For example, the busbar module 450 includes a cable management housing 452, a chassis-side busbar connector 130, and a cable 470 (e.g., a power cord). The chassis-side busbar connector 130 is configured to mate with a rack-side busbar connector 140 positioned on a rear vertical rail of a rack 120 having a rack depth Dr. The cable 470 is positioned within the cable management housing 452.

A gap 426 on the rear wall 424 allows unobstructed attachment of the busbar module 450. The gap 426 may have a width that is the same as, or greater than, the width W2 of the busbar module 250. In some implementations, if the chassis 410 is being installed to a busbar-powered rack having the same rack depth as the chassis depth D2, then a gate or a bracket may be used to seal the gap 426 when the busbar module 450 is removed.

Referring to FIG. 4B, a perspective view of the adjustable length chassis system 400 is shown with the busbar module 450 attached to the chassis 410, according to certain aspects of the present disclosure. The adjustable length chassis system 400 shown in FIG. 4B is the same as, or similar to, the adjustable length chassis system 400 shown in FIG. 4A, where same reference numerals refer to same elements. When the busbar module 450 is attached to the baseboard 210 of the chassis 410, the cable 470 extends from the chassis-side busbar connector 130 to the power distribution board 280. As such, the cable 470 communicatively couples the chassis-side busbar connector 130 to the power distribution board 280.

As shown in FIG. 4B, the busbar module 450 extends outward from the rear end 214 of the baseboard 210. The busbar module 450 is configured to aid in elongating the chassis 410, which in turn allows the front end 212 of the baseboard 210 to be flush among other components in the rack (not shown). In this example, the chassis depth D2 of the chassis 410 is 660 mm, and the rack depth Dr is 960 mm. Thus, an external length L4 of the busbar module 450 is about 300 mm, which is the difference between the chassis depth D2 and the rack depth Dr. In other words, a combination of the chassis depth D2 and the external length L4 of the busbar module 450 is about the rack depth Dr.

The external length L4 of the busbar module 450 is the portion of the busbar module 450 that extends beyond the rear end 214 of the baseboard 210, as opposed to the remaining portion of the busbar module 450 that is housed within the chassis 410. For example, the remaining portion of the busbar module 450 may include alignment holes 434 (FIG. 4A) to match and/or guide the corresponding alignment holes 432 (FIG. 4A) on the pair of anchors 430, such that the external length L4 of the busbar module 450 can be exactly the difference between the chassis depth D2 and the rack depth Dr.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A server chassis comprising:
a baseboard having a front end and a rear end, the front end and the rear end defining a chassis depth;
a busbar module having a chassis-side busbar connector positioned on a rack having a rack depth; and
a rear wall positioned along the rear end of the baseboard, the busbar module being stored entirely within a gap of the rear wall in a first configuration;
wherein the busbar module is adjustable such that the chassis-side busbar connector mates with a rack-side busbar connector in the first configuration or a second configuration, the first configuration having the rack depth being approximately equal to the chassis depth, the second configuration having the rack depth being greater than the chassis depth; and
wherein the busbar module is configured to retract and expand, thereby alternating between the first configuration and the second configuration, the busbar module being retracted between the rear end and the front end the baseboard in the first configuration, the busbar module extending outside the rear end of the baseboard in the second configuration.

2. The server chassis of claim 1, wherein a retracted length of the busbar module is between 35% to 65% of an expanded length of the busbar module.

3. The server chassis of claim 1, wherein the busbar module further includes a cable management housing, the busbar module being foldable approximately at a midpoint of the cable management housing.

4. The server chassis of claim 1, wherein the busbar module further includes a cable management housing having a proximal portion and a distal portion, the busbar module being configured to alternate between the first configuration and the second configuration while hinged to the baseboard at the distal portion of the cable management housing.

5. The server chassis of claim 4, wherein the chassis-side busbar connector is coupled to the proximal portion of the cable management housing.

6. The server chassis of claim 4, wherein the busbar module further includes:
a power distribution board positioned on the baseboard; and
a cable positioned within the cable management housing and extending from the chassis-side busbar connector to the power distribution board, thereby communicatively coupling the chassis-side busbar connector to the power distribution board.

7. A server chassis comprising:
a baseboard having a front end and a rear end, the front end and the rear end defining a chassis depth;
a power distribution board positioned on the baseboard; a busbar module having a chassis-side busbar connector, the chassis-side busbar connector being configured to mate with a rack-side busbar connector, the rack-side busbar connector being positioned on a rack having a rack depth; and
a rear wall positioned along the rear end of the baseboard, the busbar module being stored entirely within a gap of the rear wall in a first configuration;
wherein the busbar module is adjustable such that the chassis-side busbar connector mates with the rack-side busbar connector in the first configuration or a second configuration, the first configuration having the rack depth being approximately equal to the chassis depth, the second configuration having the rack depth being greater than the chassis depth;
wherein the busbar module further includes a cable management housing, the busbar module being foldable approximately at a midpoint of the cable management housing; and
wherein the busbar module is configured to retract and expand, thereby alternating between the first configuration and the second configuration, the busbar module being retracted between the rear end and the front end the baseboard in the first configuration, the busbar module extending outside the rear end of the baseboard in the second configuration.

8. The server chassis of claim 7, wherein a retracted length of the busbar module is between 35% to 65% of an expanded length of the busbar module.

9. The server chassis of claim 7, wherein the busbar module further includes a cable management housing having a proximal portion and a distal portion, the busbar module being configured to alternate between the first configuration and the second configuration while hinged to the baseboard at the distal portion of the cable management housing.

10. The server chassis of claim 9, wherein the chassis-side busbar connector is coupled to the proximal portion of the cable management housing.

11. The server chassis of claim 9, wherein the busbar module further includes a cable positioned within the cable management housing and extending from the chassis-side busbar connector to the power distribution board, thereby communicatively coupling the chassis-side busbar connector to the power distribution board.

12. A server system comprising:
a chassis having an adjustable length and including a baseboard, the baseboard having a front end and a rear end that define a chassis depth;
a power distribution board positioned on the baseboard;
a busbar module removably coupled to the baseboard and including a cable management housing having a length less than the chassis depth;

a chassis-side busbar connector coupled to the cable management housing, the chassis-side busbar connector configured to mate with a rack-side busbar connector positioned on a rack having a rack depth greater than the chassis depth; and a cable positioned within the cable management housing and configured to extend from the chassis-side busbar connector to the power distribution board, thereby communicatively coupling the chassis-side busbar connector to the power distribution board; and a rear wall positioned along the rear end of the baseboard, the busbar module being stored entirely within a gap of the rear wall in a first configuration;

wherein the busbar module is configured alternate between the first configuration and a second configuration, the busbar module being retracted between the rear end and the front end the baseboard in the first configuration, the busbar module extending outside the rear end of the baseboard in the second configuration.

13. The server system of claim 12, wherein the busbar module is configured to alternate while hinged to the baseboard.

* * * * *